(12) United States Patent
Watanabe et al.

(10) Patent No.: US 11,006,560 B2
(45) Date of Patent: May 11, 2021

(54) METHOD OF MANUFACTURING COMPONENT-MOUNTED SUBSTRATE

(71) Applicant: Panasonic Intellectual Property Management Co., Ltd., Osaka (JP)

(72) Inventors: Hideaki Watanabe, Fukuoka (JP); Dai Yokoyama, Yamanashi (JP); Shigeki Imafuku, Yamanashi (JP); Yosuke Nagasawa, Yamanashi (JP); Satoshi Matsuoka, Yamanashi (JP); Kazuo Nagae, Yamanashi (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 250 days.

(21) Appl. No.: 16/124,641

(22) Filed: Sep. 7, 2018

(65) Prior Publication Data
US 2019/0082566 A1   Mar. 14, 2019

(30) Foreign Application Priority Data

Sep. 12, 2017   (JP) .............................. JP2017-174904

(51) Int. Cl.
*H05K 3/30*   (2006.01)
*H05K 13/04*   (2006.01)
*H05K 13/08*   (2006.01)

(52) U.S. Cl.
CPC ....... *H05K 13/0413* (2013.01); *H05K 13/046* (2013.01); *H05K 13/0408* (2013.01); *H05K 13/0421* (2013.01); *H05K 13/0426* (2013.01); *H05K 3/306* (2013.01); *H05K 13/0812* (2018.08); *H05K 13/0813* (2018.08); *Y10T 29/49139* (2015.01)

(58) Field of Classification Search
USPC .... 29/837, 564.6, 566.2, 739, 741, 838, 845
See application file for complete search history.

(56) References Cited

U.S. PATENT DOCUMENTS

| | | | | |
|---|---|---|---|---|
| 4,750,263 A | * | 6/1988 | Yagi .................. | H05K 13/0417 29/837 |
| 10,568,250 B2 | * | 2/2020 | Watanabe .......... | H05K 13/0408 |
| 2016/0073511 A1 | | 3/2016 | Watanabe | |

FOREIGN PATENT DOCUMENTS

| | | |
|---|---|---|
| CN | 104378966 A | 2/2015 |
| CN | 105407699 A | 3/2016 |
| JP | 2015-037084 A | 2/2015 |

OTHER PUBLICATIONS

Chinese Office Action and Chinese Search Report issued in Chinese Patent Application No. 201810870367.7 dated Dec. 1, 2020.

* cited by examiner

*Primary Examiner* — Thiem D Phan
(74) *Attorney, Agent, or Firm* — Pearne & Gordon LLP

(57) ABSTRACT

A component mounting device configured to mount an axial component on a substrate, comprising: a movable forming-die; a fixed forming-die; a mounting head; and a distance adjustment portion, wherein the distance adjustment portion makes an adjustment such that when the movable forming-die delivers the axial component to the mounting head the distance between the claws is larger than a distance of the fixed forming-die.

4 Claims, 17 Drawing Sheets

METHOD OF MANUFACTURING COMPONENT-MOUNTED SUBSTRATE

CROSS-REFERENCE TO RELATED APPLICATIONS

The contents of specifications, drawings and claims of the Japanese patent application No. 2017-174904 filed Sep. 12, 2017 are herein expressly incorporated by reference in their entirety.

FIELD OF THE INVENTION

The present invention relates to a component mounting device configured to mount an axial component on a substrate and a method of manufacturing a component-mounted substrate using the same.

BACKGROUND OF THE INVENTION

A component mounting device is known in a mounting technical field, which uses a clamping device configured to clamp and mount axial components, that are fed by a component feeder such as a parts feeder, onto a substrate. Such a clamping device is conventionally known, which uses a mounting head configured to clamp two leads in a bent state, the two leads extending laterally from both sides of a body of an axial component, and then to mount the clamped leads on a substrate (see, e.g., Patent Document 1: JP 2015-37084 A).

The axial component is held by the parts feeder before delivery to the mounting head and are formed into a bending shape in the parts feeder. The component mounting device of Patent Document 1 includes a movable forming-die and a fixed forming-die for forming the leads into a bending shape in the parts feeder. The movable forming-die is configured to come into contact from below with leads, the leads extending laterally from a body of the axial component, to lift the leads in a bent state. The fixed forming-die is disposed outside the movable forming-die to guide a movement of the bent leads of the axial component from the outside.

The mounting head is disposed above the fixed forming-die. The bent leads are lifted by the movable forming-die, and then the axial component is delivered to the mounting head. After delivering the component, the movable forming-die retracts downward. The mounting head clamping the axial component then moves to insert the leads into insertion holes of a substrate to mount the axial component on the substrate.

SUMMARY OF THE INVENTION

In the component mounting device as disclosed in Patent Document 1, the axial component that has been delivered to the mounting head may be moved downward along with the downward movement of the movable forming-die after the delivery of the axial component, and thus the axial component may fall off from the mounting head. Therefore, there is a room for improving accurate delivery of the axial component to the mounting head.

It is therefore an object of the present invention to provide a component mounting device capable of accurately delivering an axial component to a mounting head and a method of manufacturing a component-mounted substrate using the same.

One aspect of the present invention provides a component mounting device configured to mount an axial component on a substrate, comprising: a movable forming-die configured to come into contact from below with two leads, the two leads having a spring property and extending laterally from a body of an axial component, to lift the leads in a bent state; a fixed forming-die disposed outside the movable forming-die to guide a movement of the leads in the bent state from the outside; a mounting head configured to be disposed above the fixed forming-die, the mounting head having a pair of claws configured to sandwich and clamp from both sides the leads in the bent state lifted by the movable forming-die, the mounting head being movable to insert the clamped leads into a substrate; and a distance adjustment portion configured to adjust a distance between the two claws of the mounting head, wherein the distance adjustment portion makes an adjustment such that when the movable forming-die delivers the axial component to the mounting head the distance between the claws is larger than a distance of the fixed forming-die.

Another aspect of the present invention provides a method of manufacturing a component-mounted substrate by mounting an axial component on a substrate using a component mounting device, the method comprising: a forming step of bringing a movable forming-die into contact with two leads from below, the two leads having a spring property and extending laterally from a body of the axial components, to lift the leads in a bent state, wherein a movement of the leads in the bent state lifted by the movable forming-die is guided from the outside by a fixed forming-die disposed outside the movable forming-die; a delivery step of allowing a pair of claws of a mounting head disposed above the fixed forming-die to sandwich and clamp from both sides the leads in the bent state lifted by the movable forming-die; a retraction step of retracting the movable forming-die downward after the delivery of the axial components to the mounting head; and a mounting step of moving the mounting head that is clamping the axial component such that the leads of the clamped axial component is inserted into insertion holes of the substrate for mounting, wherein at the delivery step, a distance between the claws of the mounting head is set larger than a distance of the fixed forming-die.

The present invention can provide a component mounting device capable of accurately delivering an axial component to a mounting head and a method of manufacturing a component-mounted substrate using the same.

DETAILED DESCRIPTION OF THE PREFERRED EMBODIMENTS

Figure 1:
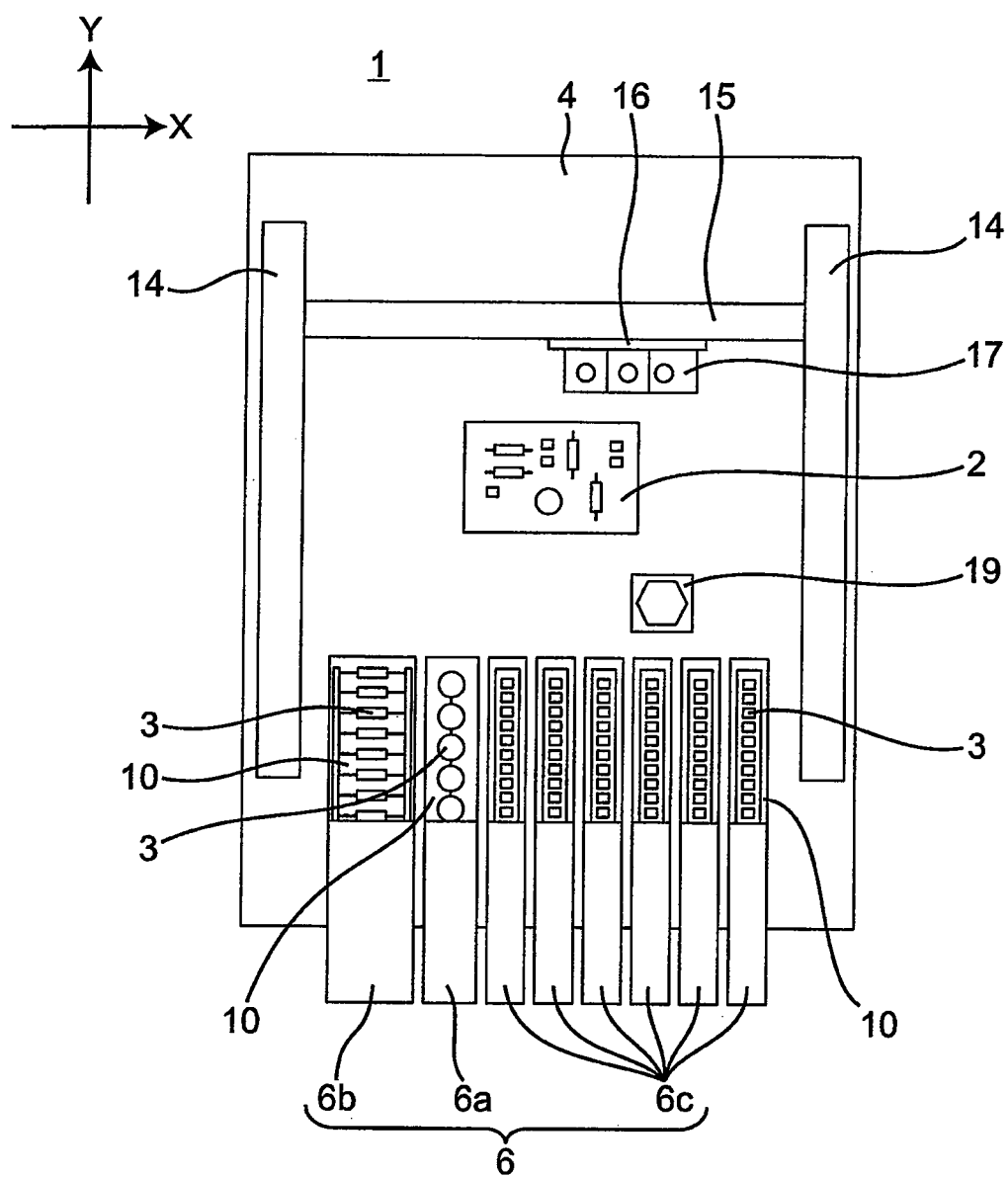
FIG. 1 is a plane view of a component mounting device according to an embodiment of the present invention.

A first aspect of the present invention provides a component mounting device configured to mount an axial component on a substrate, comprising: a movable forming-die configured to come into contact from below with two leads, the two leads having a spring property and extending laterally from a body of an axial component, to lift the leads in a bent state; a fixed forming-die disposed outside the movable forming-die to guide a movement of the leads in the bent state from the outside; a mounting head configured to be disposed above the fixed forming-die, the mounting head having a pair of claws configured to sandwich and clamp from both sides the leads in the bent state lifted by the movable forming-die, the mounting head being movable to insert the clamped leads into a substrate; and a distance adjustment portion configured to adjust a distance between the two claws of the mounting head, wherein the distance adjustment portion makes an adjustment such that when the movable forming-die delivers the axial component to the mounting head the distance between the claws is larger than a distance of the fixed forming-die.

According to the first aspect of the present invention, the adjustment is made such that when the axial component is delivered from the movable forming-die to the mounting head the distance between the claws of the mounting head is larger than the distance of the fixed forming-die, thereby leading to the accurate delivery of the axial component to the mounting head.

A second aspect of the present invention provides the component mounting device according to the first aspect, wherein after the movable forming-die has delivered the axial component to the mounting head and then retracts downward, the distance adjustment portion makes an adjustment to decrease the distance between the claws of the mounting head.

According to the second aspect of the present invention, the distance between the claws at the time of delivery is ensured to have a margin for accurate delivery and then at the time of subsequent insertion the distance has been decreased to a desired distance, thereby leading to accurate inserting of the leads into the insertion holes of the substrate.

A third aspect of the present invention provides the component mounting device according to the second aspect, wherein the distance adjustment portion makes the adjustment for decreasing the distance between the claws such that the decreased distance between the claws is smaller than the distance of the fixed forming-die.

According to the third aspect of the present invention, even when the distance between the insertion holes of the substrate is smaller than the distance of the fixed forming-die, the width of the leads can be adjusted to the distance of the insertion holes of the substrate, so that the leads can accurately be inserted into the substrate.

A fourth aspect of the present invention provides the component mounting device according to any one of the first to third aspects, wherein the distance adjustment portion makes the adjustment for delivering the axial component from the movable forming-die to the mounting head such that the claws whose distance has been adjusted press the leads from the outside.

According to the fourth aspect of the present invention, the leads of the axial component can be more firmly clamped after the delivery to the mounting head.

A fifth aspect of the present invention provides the component mounting device according to any one of the first to fourth aspects, wherein the distance adjustment portion makes the adjustment for delivering the axial component from the movable forming-die to the mounting head such that the adjusted distance between the claws is larger than the distance of the fixed forming-die by 0.2 mm or more and 0.3 mm or less.

According to the fifth aspect of the present invention, the axial component can hardly be moved downward along with the retracting movable forming-die, while allowing the mounting head to reliably clamp the axial component.

A sixth aspect of the present invention provides a method of manufacturing a component-mounted substrate by mounting an axial component on a substrate using a component mounting device, the method comprising: a forming step of bringing a movable forming-die into contact with two leads from below, the two leads having a spring property and extending laterally from a body of the axial components, to lift the leads in a bent state, wherein a movement of the leads in the bent state lifted by the movable forming-die is guided from the outside by a fixed forming-die disposed outside the movable forming-die; a delivery step of allowing a pair of claws of a mounting head disposed above the fixed forming-die to sandwich and clamp from both sides the leads in the bent state lifted by the movable forming-die; a retraction step of retracting the movable forming-die downward after the delivery of the axial components to the mounting head; and a mounting step of moving the mounting head that is clamping the axial component such that the leads of the clamped axial component is inserted into insertion holes of the substrate for mounting, wherein at the delivery step, a distance between the claws of the mounting head is set larger than a distance of the fixed forming-die.

According to the sixth aspect of the present invention, the distance between the claws of the mounting head at the delivery step is set to be larger than the distance of the fixed forming-die, thereby leading to the accurate delivery of the axial component.

A seventh aspect of the present invention provides the method of manufacturing a component-mounted substrate according to the sixth aspect, further comprising a distance reduction step of decreasing the distance between the claws after the retraction step and before the mounting head inserts the leads of the axial component into the insertion holes of the substrate.

According to the seventh aspect of the present invention, the distance between the claws at the time of delivery is ensured to have a margin for accurate delivery, and then at the time of subsequent insertion the distance has been decreased to a desired distance, thereby leading to accurate inserting of the leads into the insertion holes of the substrate.

An eighth aspect of the present invention provides the method of manufacturing a component-mounted substrate according to the seventh aspect, wherein at the distance reduction step, the distance between the claws is decreased to be shorter than the distance of the fixed forming-die.

According to the eighth aspect of the present invention, even when the distance between the insertion holes of the substrate is smaller than the distance of the fixed forming-die, the width of the leads can be adjusted to the distance of the insertion holes of the substrate, so that the leads can accurately be inserted into the substrate.

A ninth aspect of the present invention provides the method of manufacturing a component-mounted substrate according to any one of the sixth to eighth aspects, wherein at the delivery step, the distance between the claws is set such that the claws press the leads of the axial components from the outside.

According to the ninth aspect of the present invention, the leads of the axial component can be more firmly clamped after the delivery to the mounting head.

A tenth aspect of the present invention provides the method of manufacturing a component-mounted substrate according to any one of the sixth to ninth aspects, wherein at the delivery step, the distance between the claws is set to be larger than the distance of the fixed forming-die by 0.2 mm or more and 0.3 mm or less.

According to the tenth aspect of the present invention, the axial component can hardly be moved downward along with the retracting movable forming-die, while allowing the mounting head to reliably clamp the axial component.

An exemplary embodiment of a component mounting device and a method of manufacturing a component-mounted substrate using the same according to the present invention will now be described with reference to the accompanying drawings. The present invention is not limited to the specific configurations of the following embodiment, and will include configurations based on a similar technical idea.

Embodiment

A component mounting device according to an embodiment of the present invention will be described with reference to FIG. 1. A component mounting device 1 has a function of mounting a component 3 on a substrate 2. Hereinafter, an X direction is defined as a conveying direction that is horizontal to the substrate 2, a Y direction is defined as a direction which is orthogonal to the X direction and in a horizontal plane, and a Z direction is defined as a direction that is perpendicular to the XY plane.

A components feeder unit 6 is disposed on an upper surface of a base 4 of the component mounting device 1. The components feeder unit 6 includes a first feeder unit 6a for feeding radial components (i.e. radial-lead type parts), a second feeder unit 6b for feeding axial components (i.e. axial-lead type parts), and a third feeder unit 6c for feeding chip-type components. The radial component is a component that has two leads extending downward from a lower portion of a component body. The axial component is a component that has two leads extending laterally from both sides of a component body.

As described later, the component mounting device 1 of this embodiment has one common mounting head that enables to clamp the radial component and also enables to clamp the axial component. A method of clamping the chip-type component is skipped here.

The components feeder unit 6 is configured to feed the component 3 by a parts feeder 10 such as a radial feeder, an axial feeder, or a tape feeder.

Y-axis beams 14 are disposed at both ends of the base 4 in the X direction. An X-axis beam 15 is attached to the Y-axis beams 14, the X-axis beam 15 being movable in the Y direction. A plate member 16 that is plate-shaped is attached to the X-axis beam 15 with being slidable in the X direction. A mounting head (inserting head) 17 is attached to the plate member 16. Driving the X-axis beam 15 and the plate member 16 can move the mounting head 17 in the X and Y directions. The mounting head 17 has a function of receiving the component 3 from the components feeder unit 6 and a function of inserting the leads of the component 3 into insertion holes of the substrate 2.

The base 4 is provided with a components recognition camera 19 between the substrate 2 and the components feeder unit 6, the components recognition camera 19 having an imaging field that faces upward. The components recognition camera 19 is configured to take an image of the component 3 from below, the component 3 being held by the mounting head 17 moving above the camera.

Figure 2:
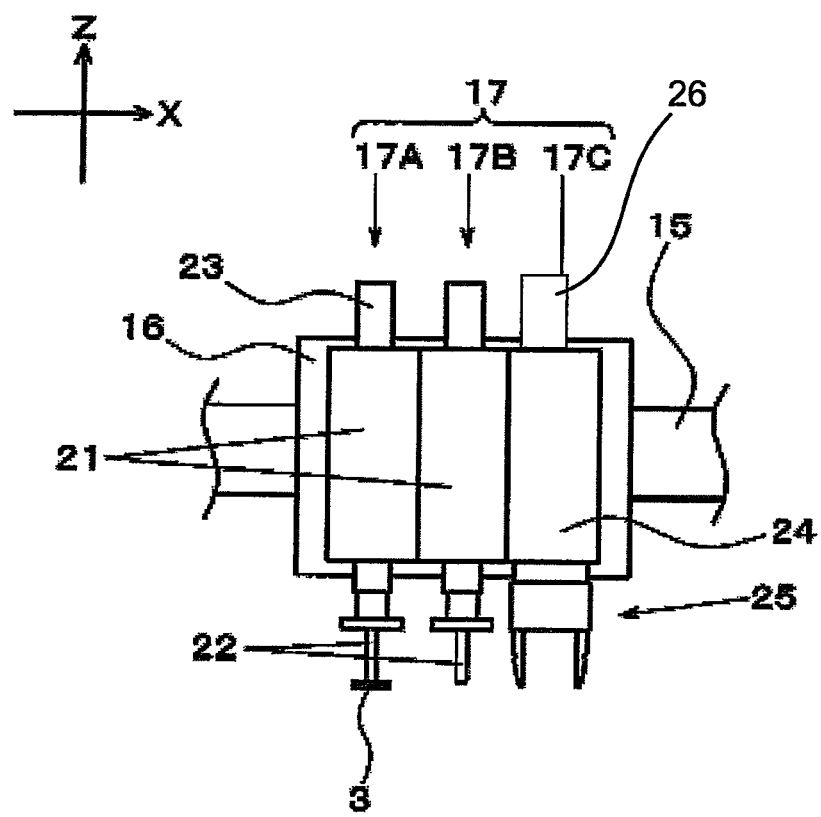
FIG. 2 is a front view of a mounting head of the component mounting device according to the embodiment of the present invention.

A configuration of the mounting head 17 will be described with reference to FIG. 2. The mounting head 17 includes multiple (in this case, three) unit heads 17A, 17B, 17C.

The unit heads 17A, 17B each include a head body 21 and a suction nozzle 22, the suction nozzle 22 being attached to a lower end portion of the head body 21. The head body 21 contains a rotary mechanism (not shown) which causes the suction nozzle 22 to rotate in the horizontal direction. The suction nozzle 22 is moved in the Z direction, i.e., raised/lowered, by a nozzle raising/lowering mechanism 23 disposed on an upper side of the head body 21. The suction nozzle 22 sucks and thereby holds the component 3 fed from the components feeder unit 6, and then transports the component 3, and then mounts the component 3 onto the substrate 2.

Although the mounting head 17 consists of the multiple unit heads 17A, 17B, 17C in this embodiment, the mounting head may consist of the only one unit head 17C without including the mounting heads 17A, 17B, for example.

The unit head 17C includes a head body 24, a chuck unit 25, and a head raising/lowering mechanism 26. The chuck unit 25 is mounted rotatably in the horizontal direction around the vertical direction (that is, Z direction) on the lower side of the head body 24.

Figure 3:
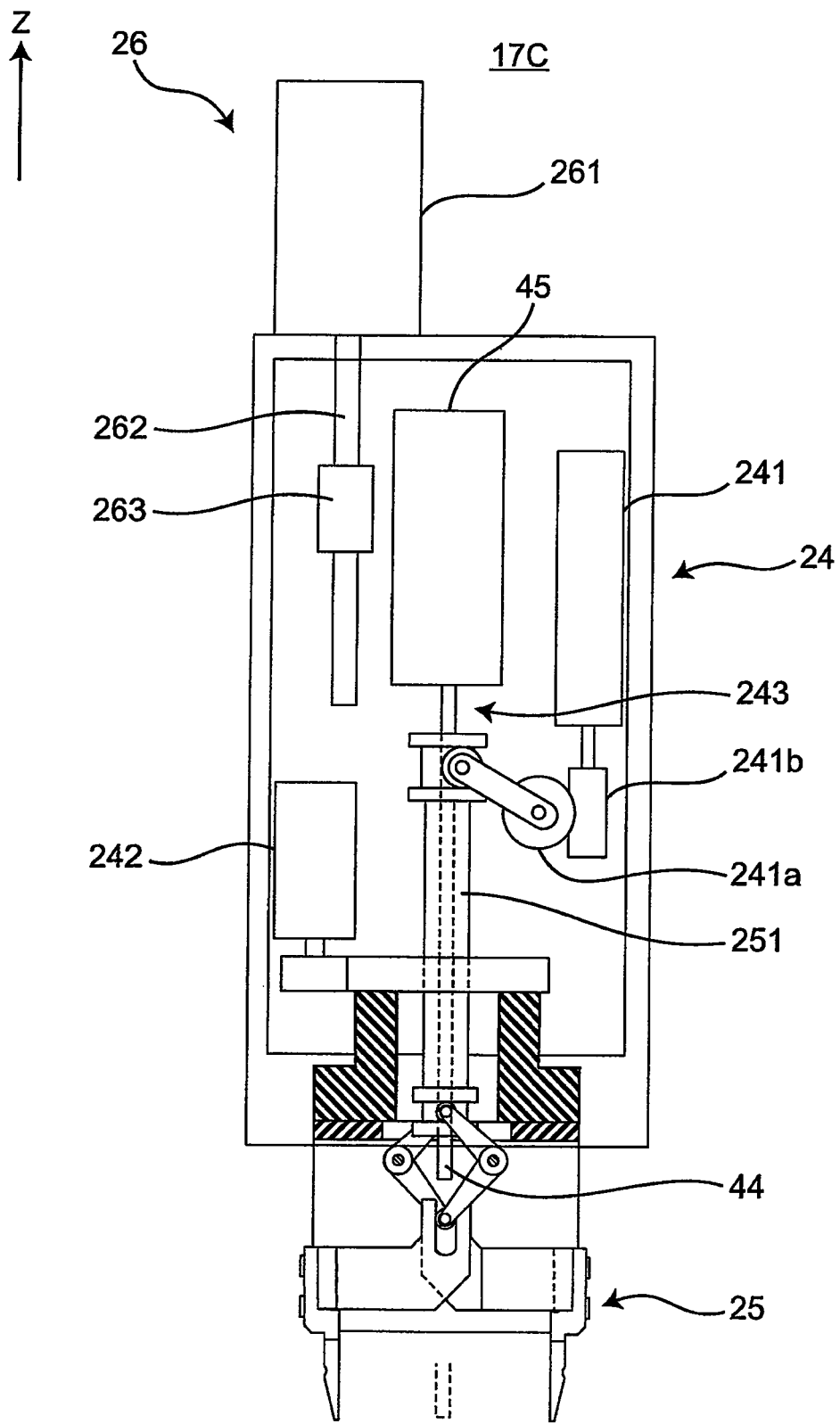
FIG. 3 shows a structure of a unit head of the component mounting device in the embodiment of the present invention.

A detailed configuration of the unit head 17C is shown in FIG. 3. The head raising/lowering mechanism 26 includes a raising/lowering motor 261, a feed screw 262, and a nut portion 263, the nut portion 263 being screwed to the feed screw 262 and also being fixed to the head body 24. The head raising/lowering mechanism 26 rotates the feed screw 262 by driving the raising/lowering motor 261 to move the nut portion 263 so that the head body 24 is moved in the Z direction, i.e., raised/lowered.

The head body 24 is provided with a chuck driving motor 241, a chuck rotating motor 242, and a pusher device 243. The chuck driving motor 241 is configured to drive the chuck unit 25, and the chuck rotating motor 242 is configured to rotate the chuck unit 25 in the horizontal direction. The pusher device 243 includes a pusher 44 and a pusher actuator 45. The pusher 44 is moved in the Z direction, i.e., raised/lowered, by the pusher actuator 45. The pusher 44 is lowered toward the component 3 being clamped by the chuck unit 25 to push down the component 3.

The chuck unit 25 includes a raising/lowering rod 251. An upper end portion of the raising/lowering rod 251 is connected via a speed reduction mechanism consisting of a worm wheel 241a and a worm gear 241b to the chuck driving motor 241. When the chuck driving motor 241 rotates the worm gear 241b, the worm wheel 241a meshed with the worm gear 241b swings. As a result, the raising/lowering rod 251 coupled to the worm wheel 241a is moved in the Z direction, i.e., raised/lowered.

A configuration of the chuck unit 25 will be described with reference to FIGS. 4A to 7. The chuck unit 25 has a pair of claws 39a, 39b configured to clamp the component 3. The claws 39a and 39b are both connected to the raising/lowering rod 251 of the head raising/lowering mechanism 26 via different members. By raising/lowering the raising/lowering rod 251, the claws 39a, 39b are moved closer to or away from each other, thereby adjusting a distance between the claw 39a and the claw 39b.

Connection structures between the raising/lowering rod 251 and the claws 39a, 39b will hereinafter be described in more detail. Although the chuck unit 25 can be rotated in the horizontal direction by a motor not shown, the description here assumes that the X direction in the horizontal plane corresponds to a clamping direction of the component 3 by the chuck unit 25, while the Y direction in the horizontal plane corresponds to a direction orthogonal to the clamping direction.

One end portion of a lever 92a is connected via a roller 91a to one side of a lower end portion of the raising/lowering rod 251. The roller 91a is disposed movably in the X direction relative to the raising/lowering rod 251. By raising/lowering the raising/lowering rod 251, the lever 92a is allowed to pivot around a lever support shaft 93a. The other end portion of the lever 92a is connected to a slide portion 95a via a roller 94a. The slide portion 95a can slide in the X direction as the lever 92a pivots. The slide portion 95a is engaged with a rail 97a via a slide block 96a, the rail 97a being attached to a frame 252. The slide portion 95a slides in the X direction along the rail 97a.

Particularly, a claw attachment seat 98a is fixed to the slide portion 95a, and the claw 39a is attached to the claw attachment seat 98a by screws 99a. Therefore, when the slide portion 95a slides, the claw 39a moves in the same direction as the sliding direction of the slide portion 95a.

Figure 4A:
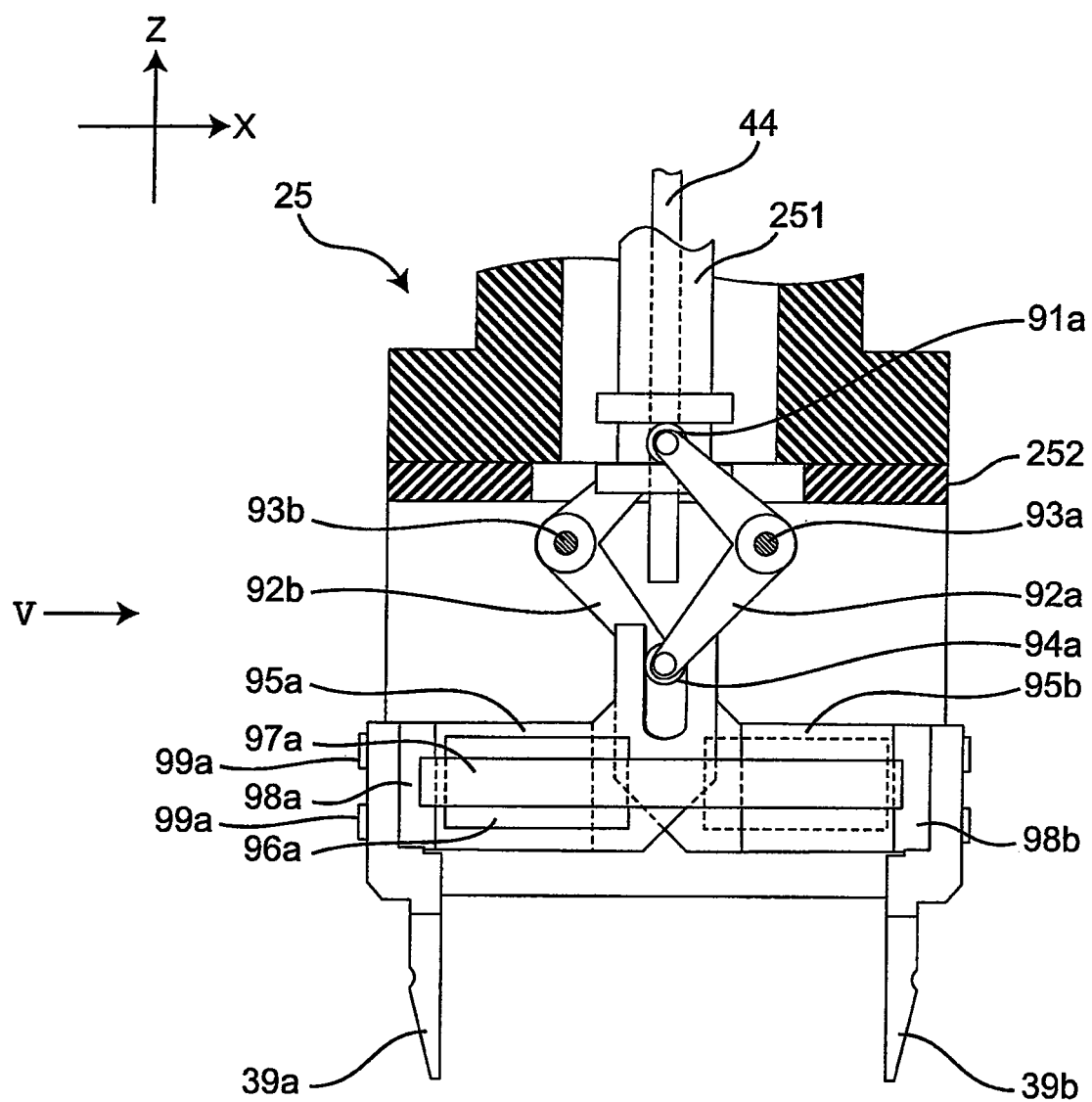
FIG. 4A shows a structure of a chuck unit of the component mounting device in the embodiment of the present invention.
Figure 4B:
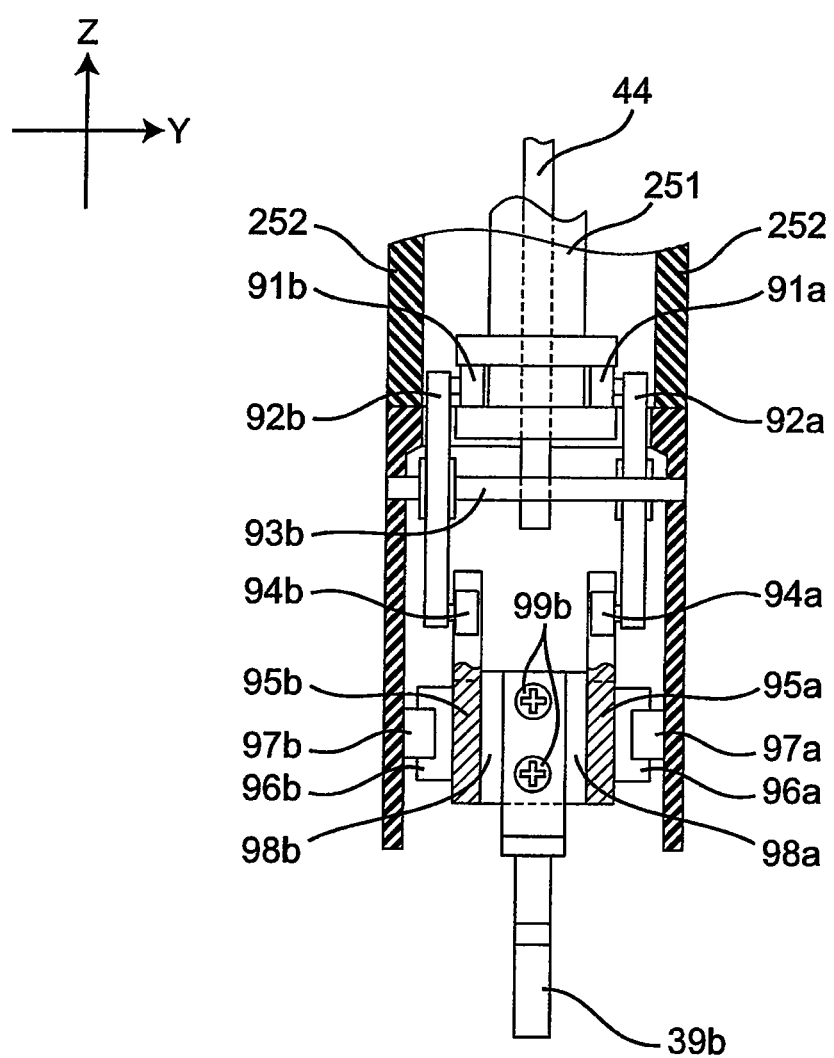
FIG. 4B is a drawing viewing from "V" of FIG. 4A.

On the other hand, as shown in FIG. 4B, one end portion of a lever 92b is connected via a roller 91b to the other side of the lower end portion of the raising/lowering rod 251. The roller 91b is disposed movably in the X direction relative to the raising/lowering rod 251. By raising/lowering the raising/lowering rod 251, the lever 92b is allowed to pivot around a lever support shaft 93b. The other end portion of the lever 92b is connected to a slide portion 95b. The slide portion 95b can slide in the X direction as the lever 92b pivots. The slide portion 95b is engaged with a rail 97b via a slide block 96b, the rail 97b being attached to the frame 252. The slide portion 95b slides in the X direction along the rail 97b.

Particularly, a claw attachment seat 98b is fixed to the slide portion 95b, and the claw 39b is attached to the claw attachment seat 98b with screws 99b. Therefore, when the slide portion 95b slides, the claw 39b moves in the same direction as the sliding direction of the slide portion 95b.

Particularly, as shown in FIG. 4B, the rail 97a and the rail 97b are oppositely disposed away from each other in the Y direction, being on inner surfaces of the frame 252. Therefore, the slide portion 95a sliding along the rail 97a and the slide portion 95b sliding along the rail 97b do not interfere with each other. Positions of the claw 39a and the claw 39b can be adjusted in the Y direction by the claw attachment seat 98a and the claw attachment seat 98b. In the embodiment, the claw 39a and the claw 39b are arranged to face each other in the X direction.

As described above, the chuck unit 25 functions as a distance adjustment portion configured to adjust a distance between the claw 39a and the claw 39b (that is, the distance between the claws 39).

Figure 5:
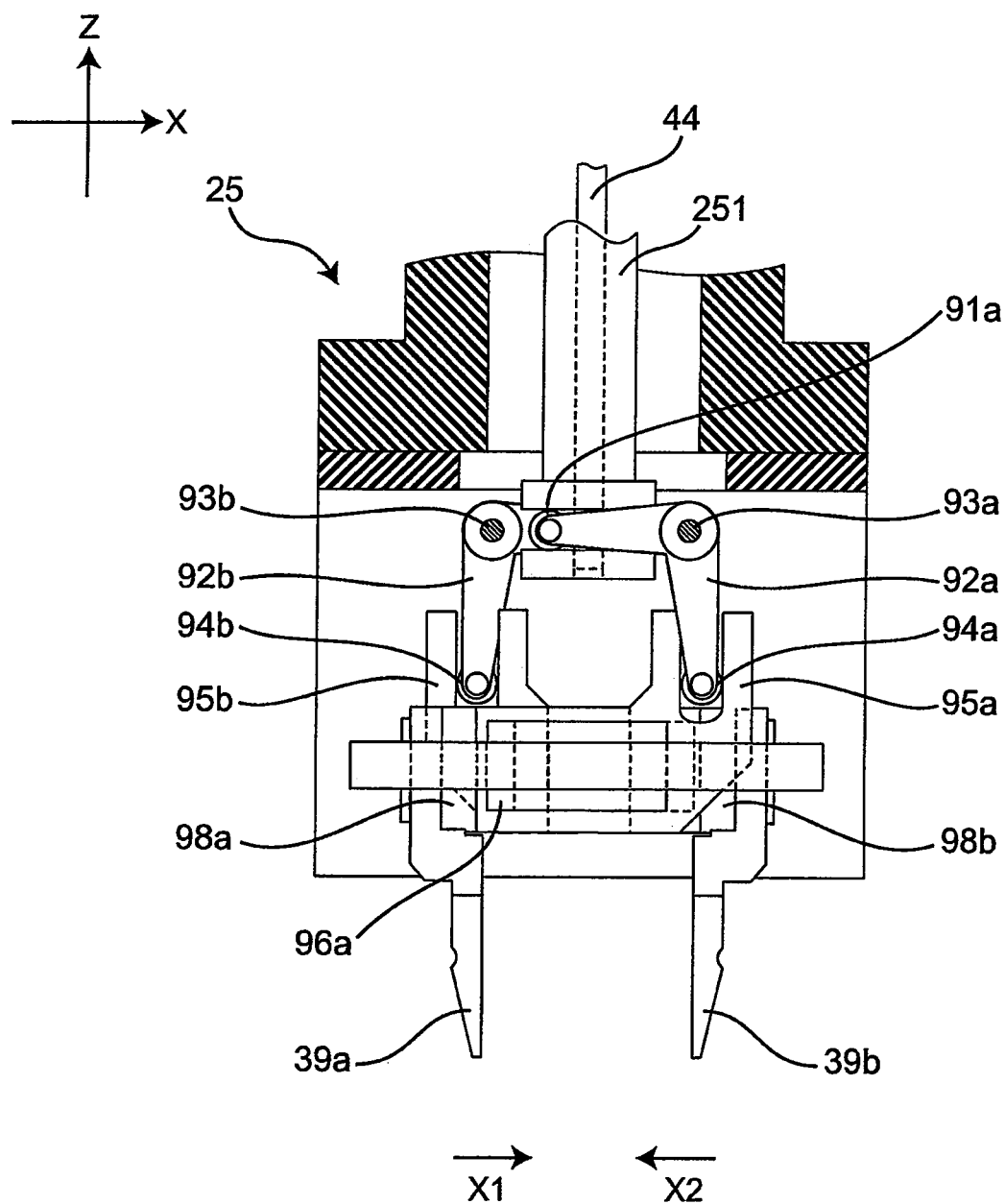
FIG. 5 is a drawing for explaining an operation of a chuck unit.

The movement of the claws 39a, 39b will hereinafter be described with reference to FIGS. 4A, 5, and 6.

FIG. 4A shows a state in which the raising/lowering rod 251 is located at its highest position. When the raising/lowering rod 251 is located at the highest position, the claw 39a and the claw 39b are most distant from each other. When the raising/lowering rod 251 is lowered as shown in FIG. 5, the rollers 91a, 91b are accordingly lowered. As the rollers 91a, 91b are lowered, the lever 92a pivots around the lever support shaft 93a, and the lever 92b pivots around the lever support shaft 93b. As the lever 92a pivots, the slide portion 95a slides in an X1 direction via the roller 94a. Similarly, as the lever 92b pivots, the slide portion 95b slides in an X2 direction via the roller 94a. The movement of the slide portions 95a, 95b causes the claws 39a, 39b to move closer to each other.

Figure 6:
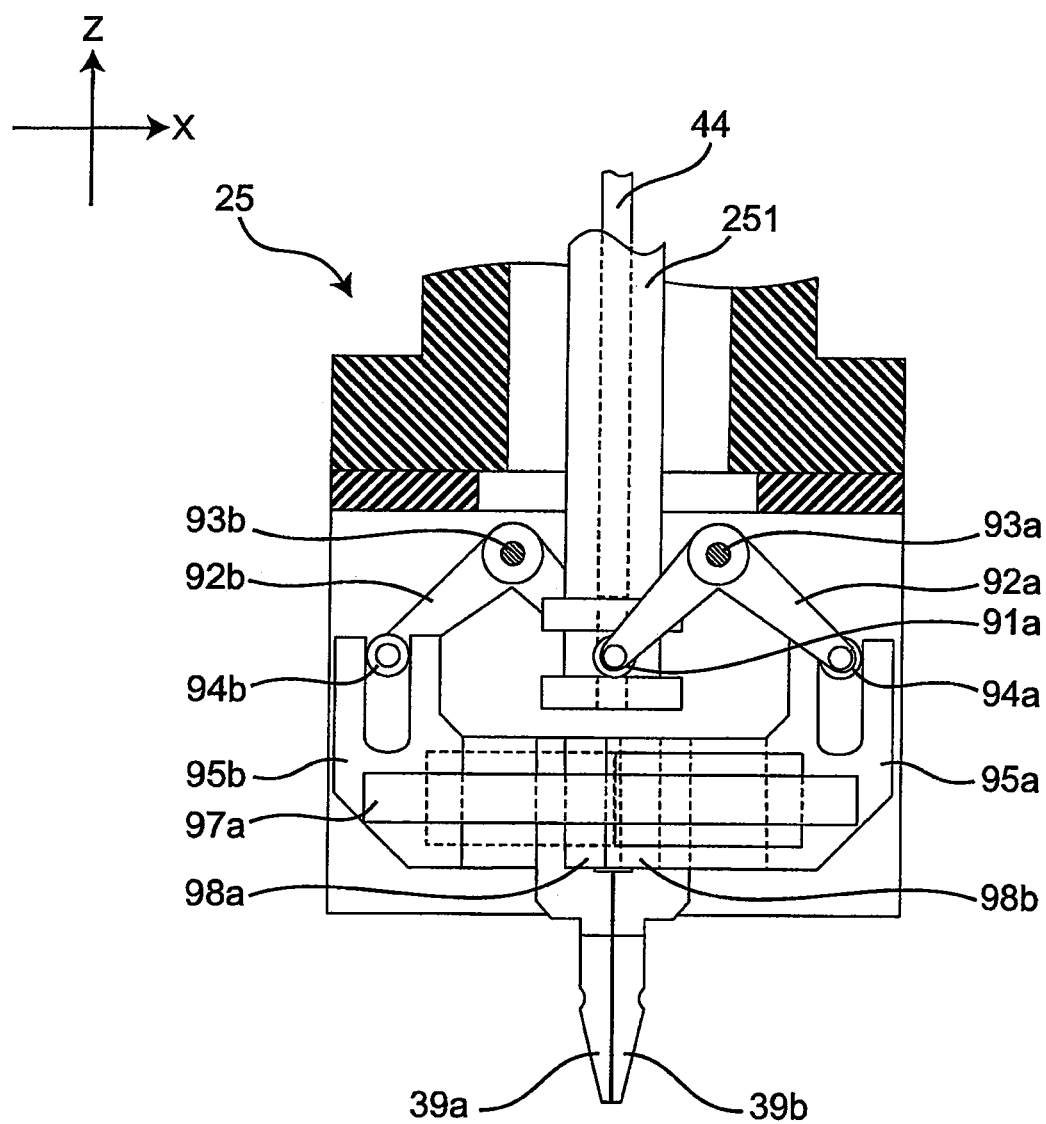
FIG. 6 is a drawing for explaining an operation of the chuck unit.

When the raising/lowering rod 251 is further lowered to its lowest position as shown in FIG. 6, the rollers 91a, 91b are further lowered. The levers 92a, 92b accordingly pivot, thereby sliding the slide portions 95a, 95b in the X1 and X2 directions, respectively. The movement of the slide portions 95a, 95b causes the claws 39a, 39b to contact with each other.

Figure 7:
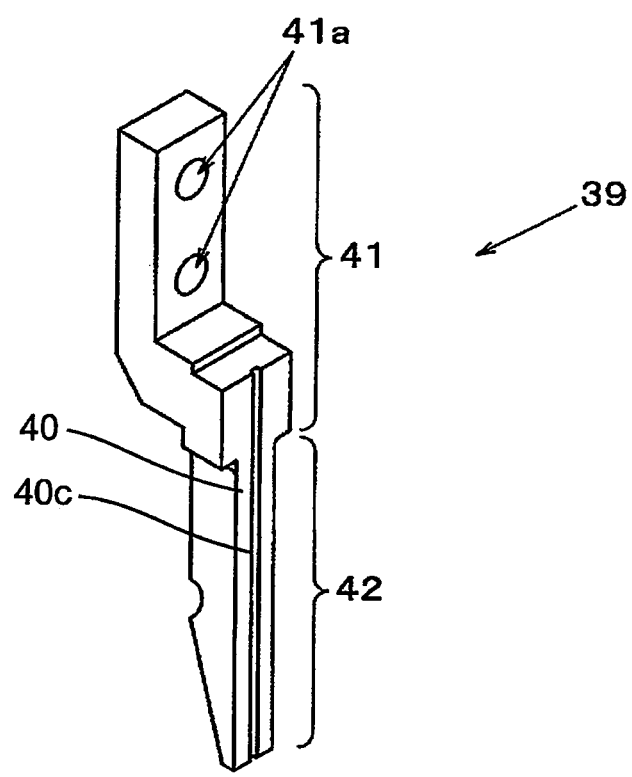
FIG. 7 is a perspective view of a claw of the chuck unit.

The claws 39 are used for chucking (clamping) the component 3 and are made of metal which is resistant to abrasion. As shown in FIG. 7, the claws 39 each include a generally L-shaped base portion 41 and a clamping portion 42, the clamping portion 42 extending in the vertical direction from the lower side of the base portion 41. Multiple holes 41a are formed in the base portion 41, and the screws 99a, 99b are screwed through the holes 41a into screw holes of the claw attachment seats 98a, 98b.

A clamping surface 40 of the claw 39 is configured to clamp the radial component and also to clamp the axial component described above. The clamping surface 40 particularly has a holding groove 40c for holding a lead of the axial component. The holding groove 40c extends toward a distal end of the claw 39 to guide the lead of the axial component toward the substrate 2.

Figure 8A:
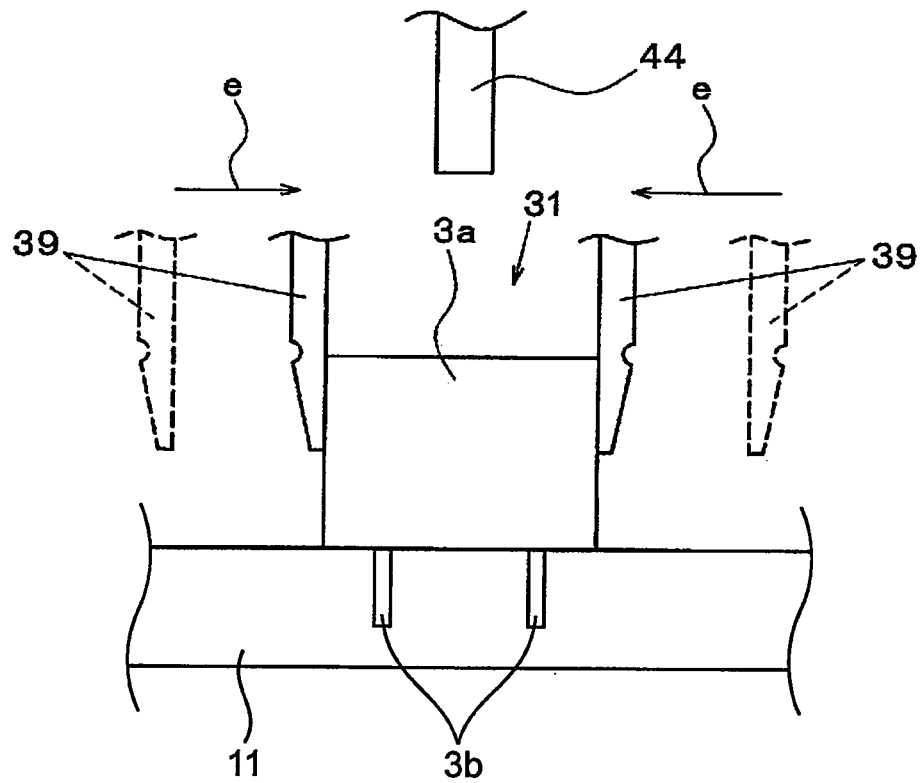
FIG. 8A is a drawing for explaining a mounting operation of a radial component using the chuck unit in the embodiment of the present invention.
Figure 8B:
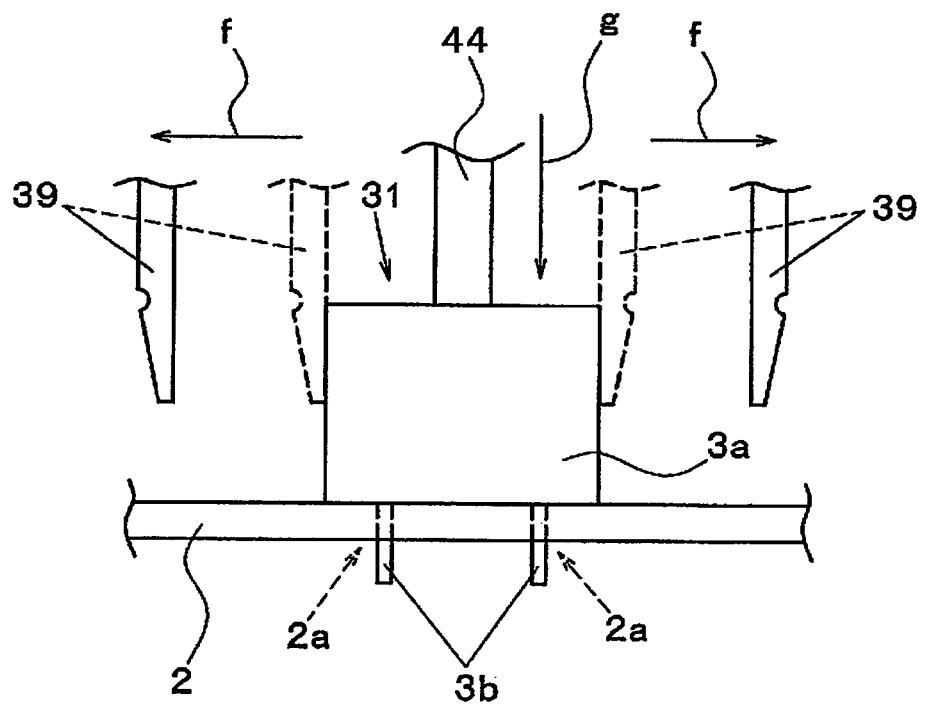
FIG. 8B is a drawing for explaining a mounting operation of a radial component using the chuck unit in the embodiment of the present invention.

With reference to FIGS. 8A and 8B, description will be made regarding a clamping operation of the component and a mounting operation of the component onto the substrate 2 using the chuck unit 25, where the component 3 is a radial component (referred to as "first component") 31. The operation described below is implemented when a controller 70 (FIG. 13) of the component mounting device 1 controls the members of the component mounting device 1.

As shown in FIG. 8A, the radial component 31 as a work object of the chuck unit 25 includes a pair of leads (referred to as "first leads") 3b on a lower surface of a body (referred to as "first body") 3a. The radial component 31 is fed by the first feeder unit 6a. The first feeder unit 6a includes a conveying chute 11. The conveying chute 11 conveys the radial component 31 to a feed position for the chuck unit 25 while supporting the lower surface of the body 3a.

As shown in FIG. 8A, a pair of the claws 39 is lowered toward the conveying chute 11 to hold the body 3a of the radial component 31 from both sides, with being positioned away from each other (see the broken lines). The pair of the claws 39 then move to approach with each other (see arrow "e") to sandwich the body 3a. As a result, the pair of the claws 39 clamps the radial component 31, with the radial component 31 being sandwiched by the clamping surfaces 40 of the claws 39. That is, the pair of the claws 39 can be referred to as clamping members configured to sandwich and clamp the radial component 31.

Subsequently, the pair of the claws 39 clamping the radial component 31 is moved to a position above the substrate 2 that has been preliminarily positioned at a work position. More specifically, the mounting head 17 having the claws 39 is raised in the Z direction and is then moved in the X and Y directions to the position above the substrate 2. As shown in FIG. 8B, the pair of the claws 39 is then lowered toward the substrate 2 to bring the lower surface of the body 3a into contact with the substrate 2 while inserting the leads 3b into insertion holes 2a in the substrate 2. The pair of the claws 39 then moves in directions to be away from each other (see arrow "f") for releasing the clamping of the radial component 31. The pusher 44 is then lowered (see arrow "g") to push the radial component 31 against the substrate 2. Subsequently, the leads 3b are clinched by a clinching mechanism (not shown). As a result, the radial component 31 is mounted on the substrate 2.

With reference to FIGS. 9A to 10B, description will be made regarding a clamping operation of an axial component (referred to as "second component") 32 as the component 3 and a mounting operation onto the substrate 2 using the chuck unit 25.

Figure 9A:
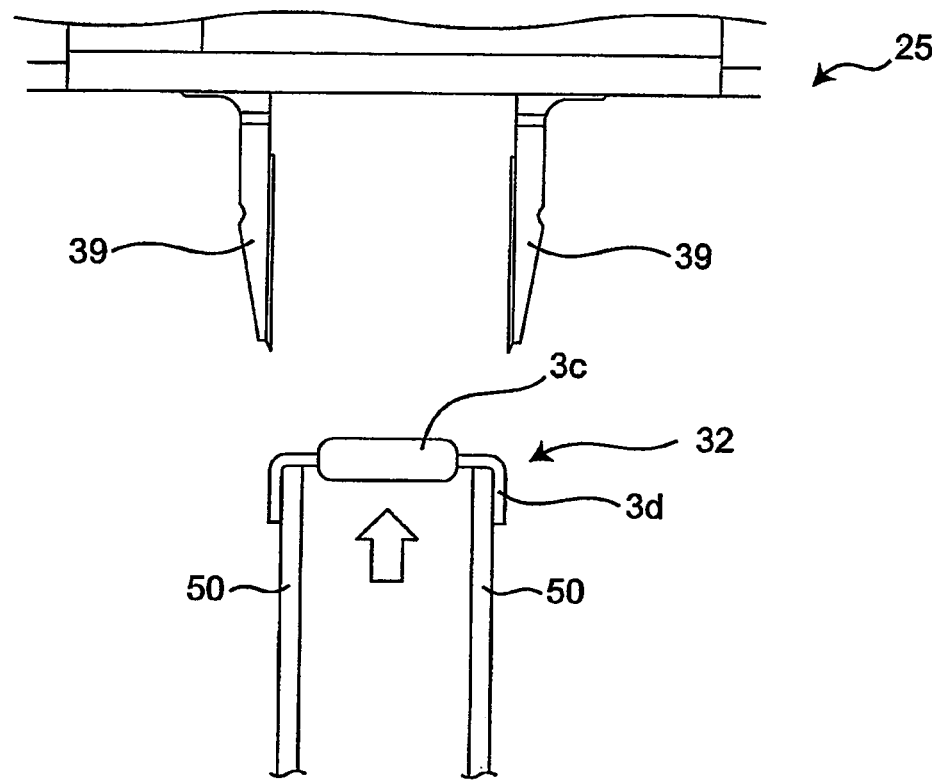
FIG. 9A is a drawing for explaining a delivery operation of an axial component using the chuck unit in the embodiment of the present invention.
Figure 9B:
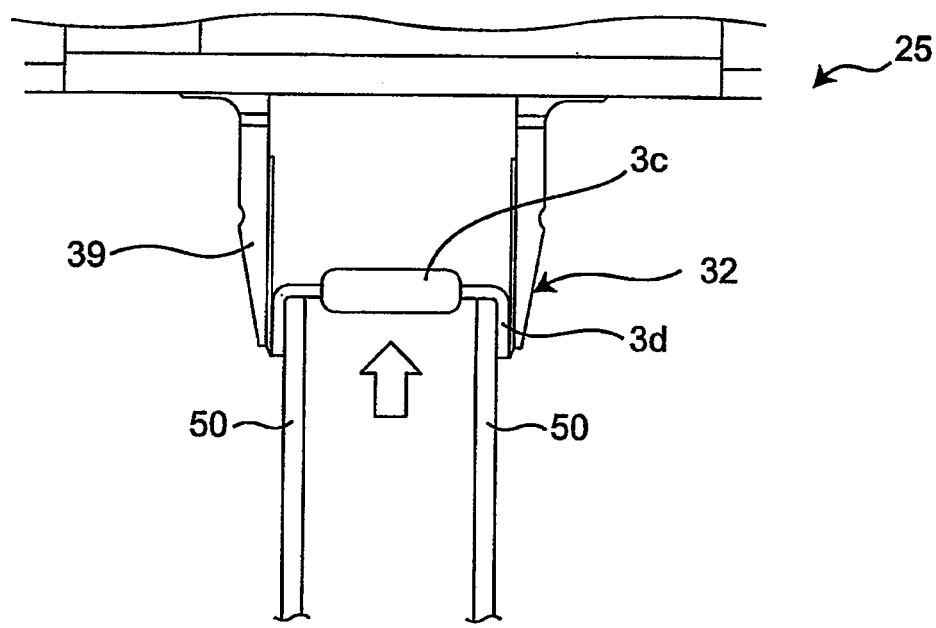
FIG. 9B is a drawing for explaining a delivery operation of an axial component using the chuck unit in the embodiment of the present invention.
Figure 10A:
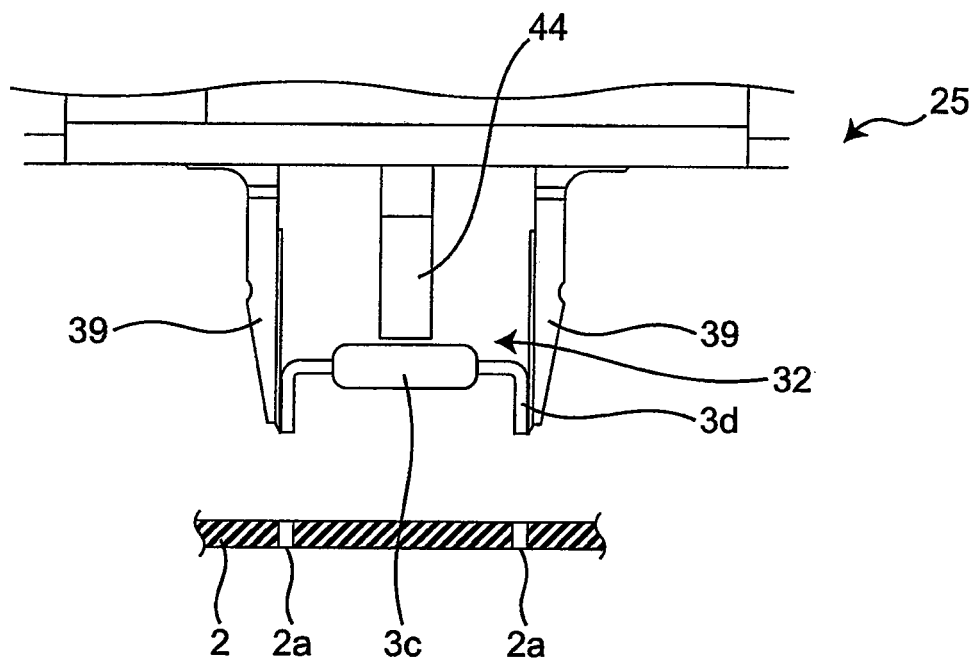
FIG. 10A is a drawing for explaining a mounting operation of an axial component using the chuck unit in the embodiment of the present invention.
Figure 10B:
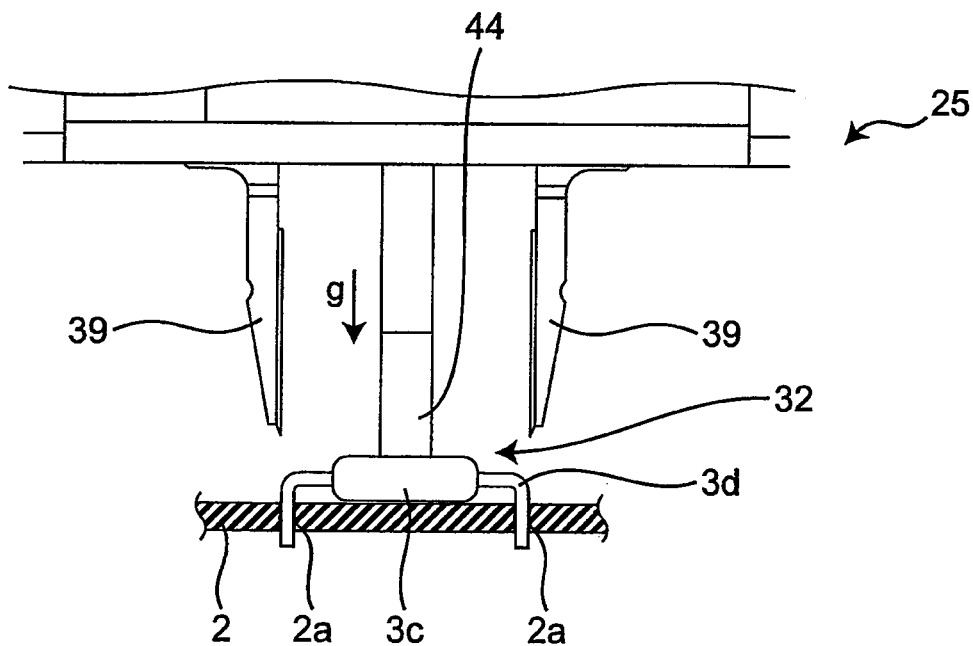
FIG. 10B is a drawing for explaining a mounting operation of an axial component using the chuck unit in the embodiment of the present invention.

As shown in FIG. 9A, the axial component 32 as a work object of the chuck unit 25 has leads (referred to as "second leads") 3d that project laterally from both sides of a body (referred to as "second body") 3c and are bent downward. The axial component 32 is fed from the parts feeder 10. The parts feeder 10 is provided with a movable forming-die 50. The movable forming-die 50 is brought into contact from below with the leads 3d of the axial component 32 to be raised. As the movable forming-die 50 is raised, the axial component 32 is delivered from the movable forming-die 50 to the claws 39 as shown in FIG. 9B. The leads 3d are held in the holding grooves 40c of the claws 39, thereby clamping the axial component 32 by the claws 39.

Subsequently, the chuck unit 25 is raised by the head raising/lowering mechanism 26, thereby raising the component 3 from the parts feeder 10, with the claws 39 clamping the axial component 32.

Subsequently, the pair of the claws 39 clamping the component 3 is moved to above the substrate 2 that has been preliminarily positioned at a work position. More specifically, the chuck unit 25 having the claws 39 is raised in the Z direction and is then moved in the X and Y directions to a position above the substrate 2.

The pair of the claws 39 is then lowered toward the substrate 2 to bring the lower surface of the body 3c into contact with the substrate 2 while inserting the leads 3d into the insertion holes 2a formed in the substrate 2. The pair of the claws 39 then moves upward to release the clamping of the axial component 32. The pusher 44 is then lowered (see arrow "g") to push the axial component 32 against the substrate 2. Subsequently, the leads 3d are clinched by a clinching mechanism (not shown). As a result, the axial component 32 is mounted on the substrate 2.

According to the method described above, the common claws 39 can clamp and insert two types of components, i.e., the radial component 31 and the axial component 32, into the insertion holes 2a of the substrate 2.

Especially, the component mounting device 1 of this embodiment has an effort to more accurately deliver the axial component 32 to the claws 39 as shown in FIG. 9B. More specific description will be made with reference to FIGS. 11 and 12A to 12H.

Figure 11:
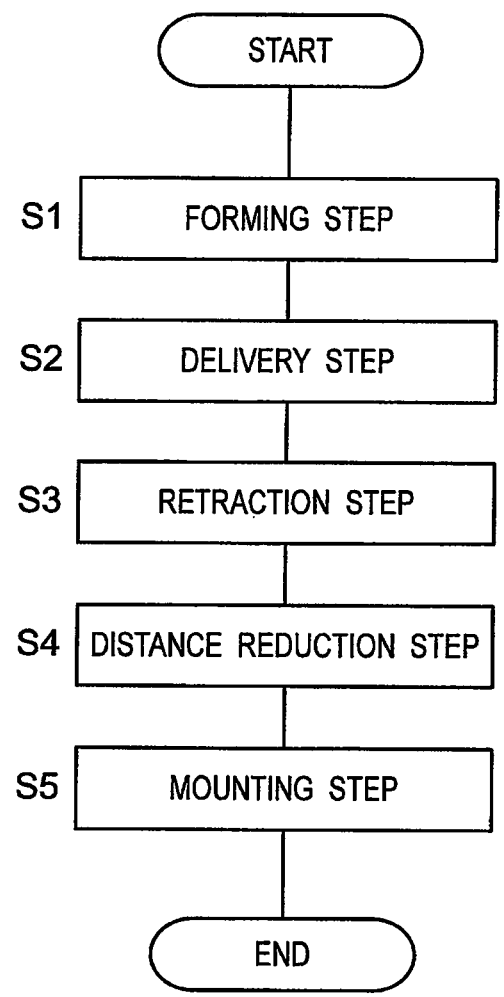
FIG. 11 is a flowchart of a method of the embodiment of the present invention.

FIG. 11 is a flowchart of the method of the embodiment. FIGS. 12A to 12H are schematic longitudinal sectional views for explaining the method of the embodiment.

Figure 12A:
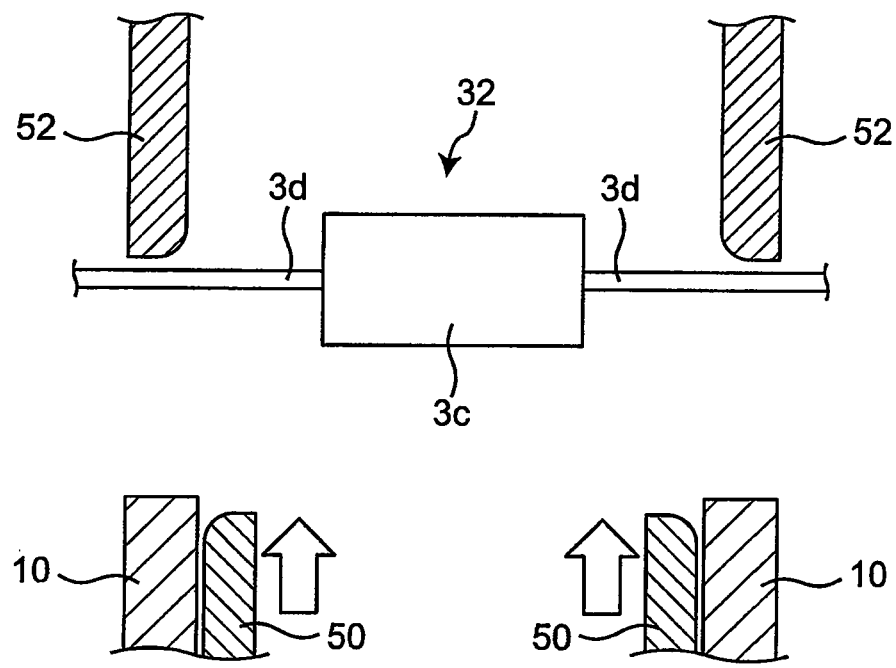
FIG. 12A is a schematic longitudinal sectional view for explaining a method of the embodiment of the present invention.

As shown in FIG. 11, a forming step is firstly performed (step S1). More specifically, as shown in FIG. 12A, the movable forming-die 50 that has been disposed inside the parts feeder 10 is raised. The movable forming-die 50 is movable upward and downward along the parts feeder 10. A fixed forming-die 52 is disposed above the parts feeder 10 and fixed for no moving up and down. The leads 3d of the axial component 32 are arranged between the parts feeder 10 and the fixed forming-die 52. The leads 3d of the axial component 32 linearly extend in lateral directions from the body 3c and are held without being bent (that is, in a non-bent state). In such an arrangement, the movable forming-die 50 is raised to lift the leads 3d.

Figure 12B:
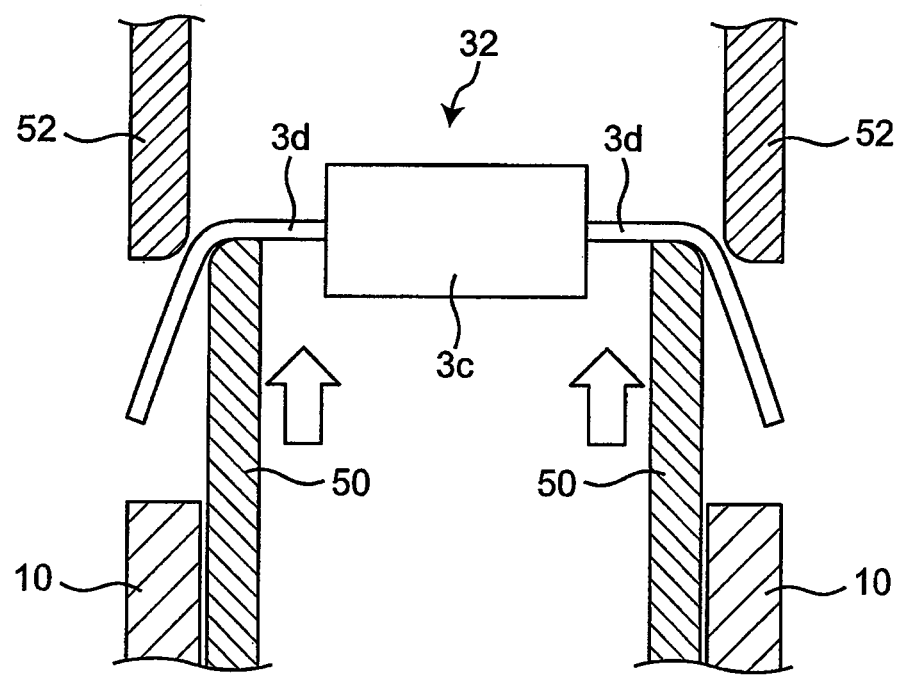
FIG. 12B is a schematic longitudinal sectional view for explaining the method of the embodiment of the present invention.

As shown in FIG. 12B, when the movable forming-die 50 rises and comes into contact with the leads 3d, the leads 3d are bent. When the movable forming-die 50 further rises, the bent leads 3d come into contact with the fixed forming-die 52.

Figure 12C:
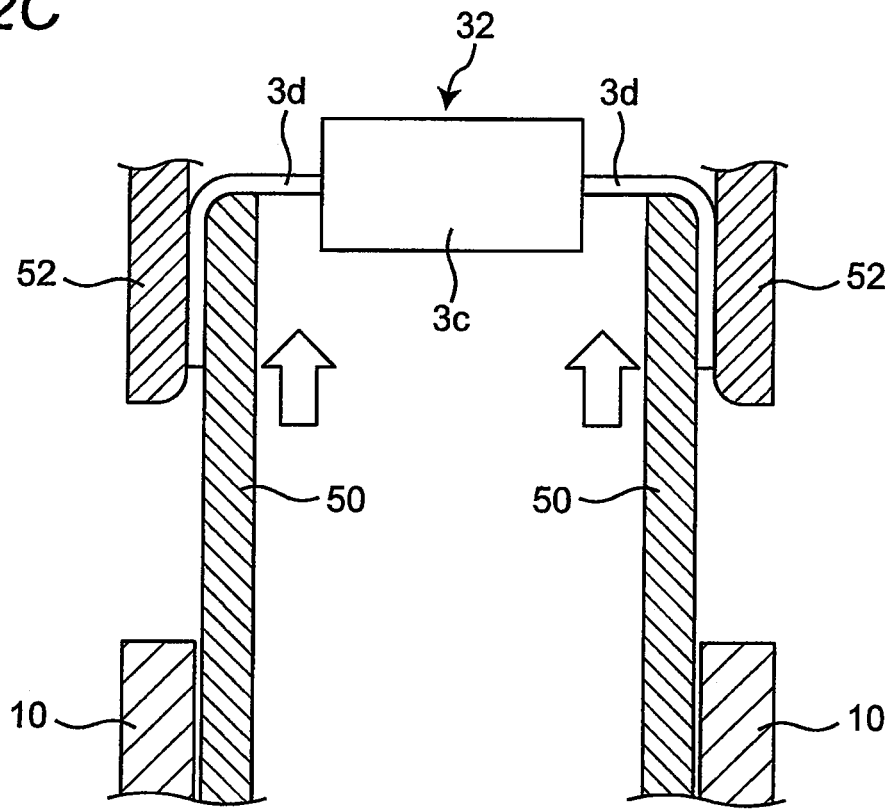
FIG. 12C is a schematic longitudinal sectional view for explaining the method of the embodiment of the present invention.

When the movable forming-die 50 further rises, as shown in FIG. 12C, the leads 3d are raised in a bent state. At this time, the fixed forming-die 52 guides the leads 3d being raised in the bent state.

In this way, the leads 3d of the axial component 32 are formed into a bent shape from the sides of the body 3c for insertion into the insertion holes 2a of the substrate 2. The component mounting device 1 of this embodiment performs the shape forming of the axial component 32 in the parts feeder 10 rather than in the mounting head 17.

Figure 12D:
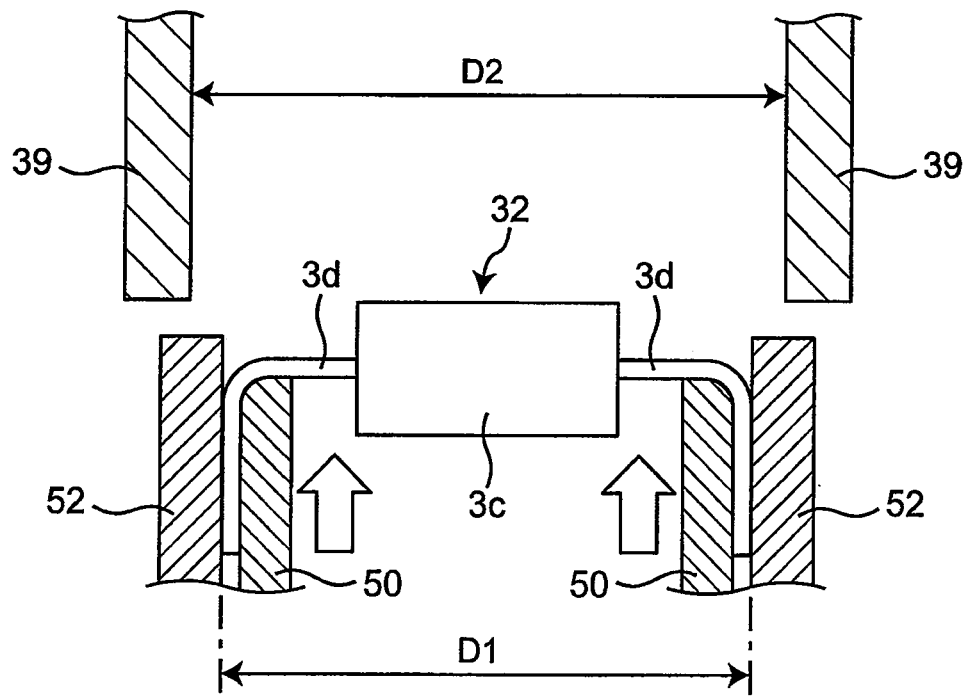
FIG. 12D is a schematic longitudinal sectional view for explaining the method of the embodiment of the present invention.

A delivery step is then performed (step S2). Specifically, the axial component 32 having the leads 3d are delivered from the movable forming-die 50 to the claws 39 of the mounting head 17. More specifically, as shown in FIG. 12D, the claws 39 of the mounting head 17 has been disposed above the fixed forming-die 52 at a slight distance. Further raising the movable forming-die 50 will deliver the axial component 32 to the claws 39.

Figure 12E:
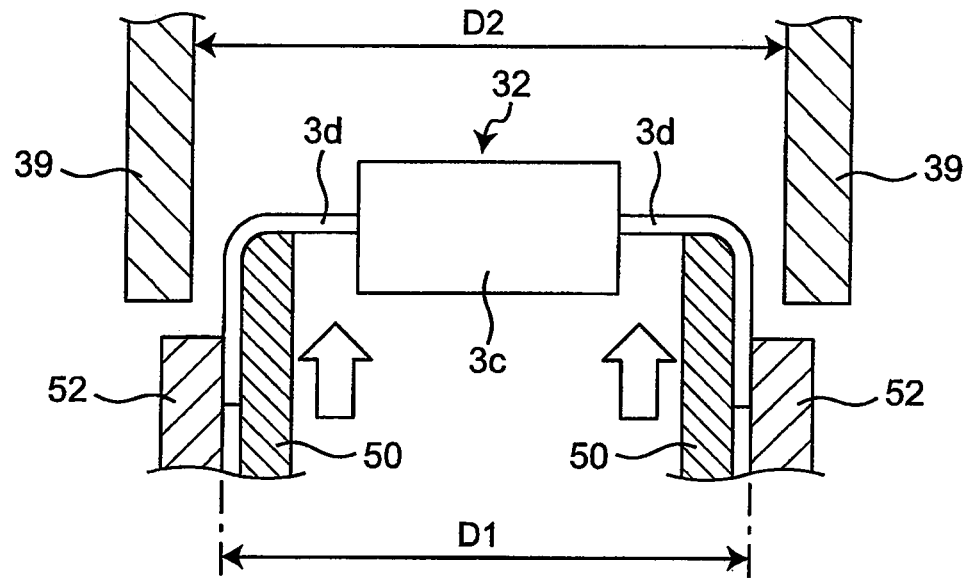
FIG. 12E is a schematic longitudinal sectional view for explaining the method of the embodiment of the present invention.

Beforehand, the chuck unit 25 serving as a distance adjustment portion described above has set a distance D2 of the claws 39 to be larger than a distance D1 of the fixed forming-die 52. Setting the distance D2 of the claws 39 in this way can more easily dispose the axial component 32 in a space between the claws 39 as shown in FIG. 12E.

Figure 12F:
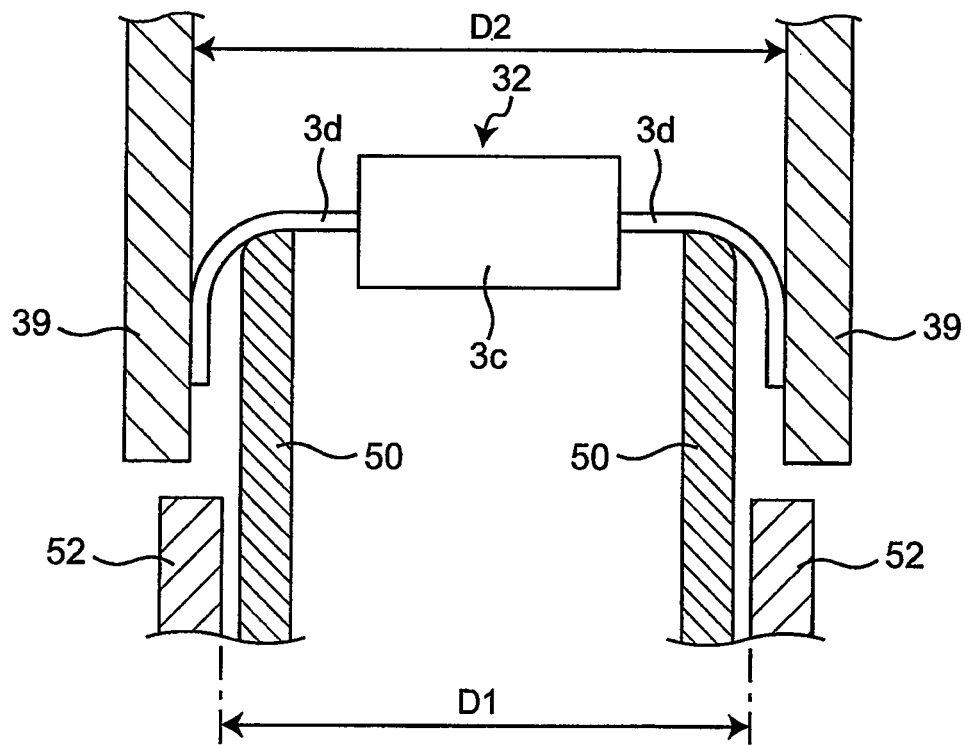
FIG. 12F is a schematic longitudinal sectional view for explaining the method of the embodiment of the present invention.

As shown in FIG. 12F, when the axial component 32 is disposed in the space between the claws 39, the leads 3d of the axial component 32 come into contact with inner walls of the claws 39. The leads 3d are made of a material (e.g., soft conducting wire) having a spring property, which generates a force returning to a state before the shape forming (referred to as "spring back"). As a result, the leads 3d spread outward to come into contact with the inner walls of the claws 39, which allows the claws 39 to clamp the leads 3d of the axial component 32. The distance D2 of the claws 39 of this embodiment is set to such a width that the leads 3d are pressed from the outside by the claws 39.

As the leads 3d spread outward, a contact region between the leads 3d and the movable forming-die 50 supporting the leads 3d from below becomes smaller as shown in FIG. 12F.

Figure 12G:
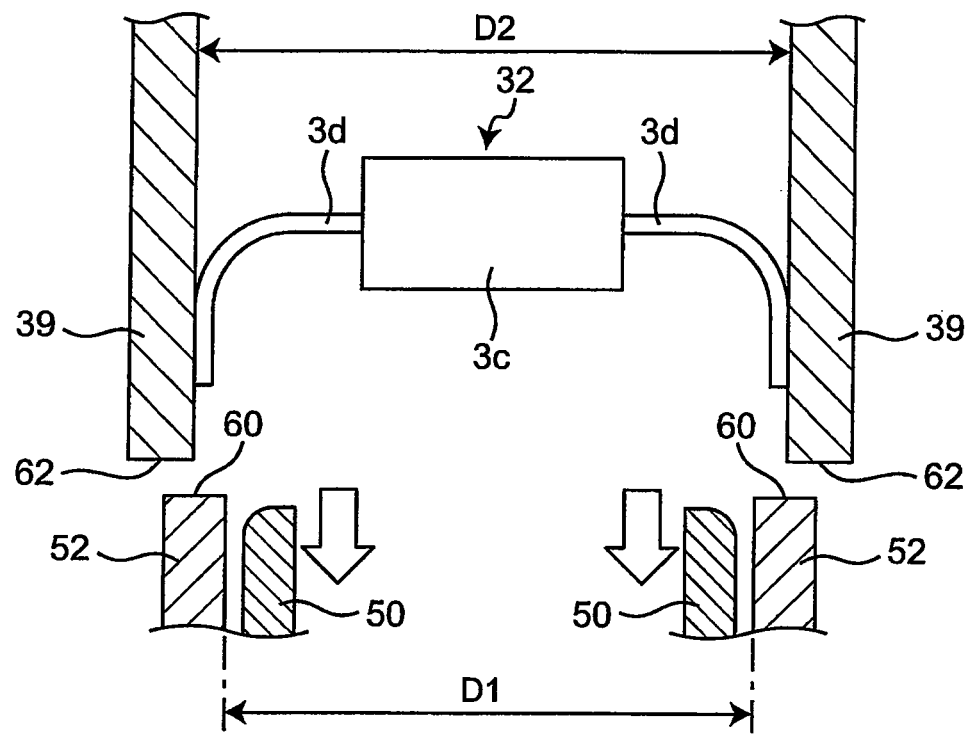
FIG. 12G is a schematic longitudinal sectional view for explaining the method of the embodiment of the present invention.

A retraction step is then performed (step S3). More specifically, the movable forming-die 50 having delivered the axial component 32 to the claws 39 retracts downward as shown in FIG. 12G. The leads 3d delivered to the claws 39 has spread outward and has small contact with the movable forming-die 50 as described above. Therefore, even when the movable forming-die 50 is lowered, the leads 3d are hardly lowered along with the movable forming-die 50. Thus, the axial component 32 can be restrained from falling off from the claws 39, and thus the axial component 32 can accurately be delivered to the claws 39.

Particularly, in this embodiment, the distance D2 of the claws 39 has been set to be larger than the distance D1 of the fixed forming-die 52 by 0.2 mm or more and 0.3 mm or less. According to such a setting, the axial component 32 can hardly be moved downward along with the movable forming-die 50 when the movable forming-die 50 retracts, while allowing the claws 39 of the mounting head 17 to reliably clamp the axial component 32.

In case the axial component 32 is moved downward along with the retracting movable forming-die 50, further lowering of axial component 32 will be restricted by a step (i.e. offset) formed between the fixed forming-die 52 and the claws 39. More specifically, upper end portions 60 of the fixed forming-die 52 are located inside lower end portions 62 of the claws 39. Therefore, in case the leads 3d of the axial component 32 is moved downward along with the retracting movable forming-die 50, the leads 3d will contact with the upper end portions 60 of the fixed forming-die 52 and can no longer be lowered. Thus, the axial component 32 can more reliably be prevented from falling off.

Figure 12H:
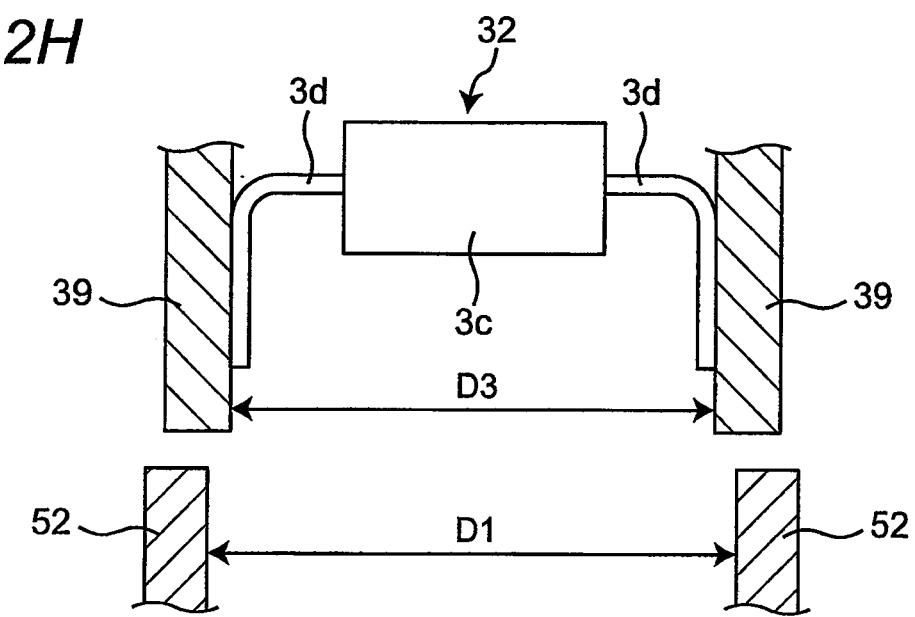
FIG. 12H is a schematic longitudinal sectional view for explaining the method of the embodiment of the present invention.

A distance reduction step is then performed (step S4). More specifically, the chuck driving motor 241 of the chuck unit 25 is driven to adjust the distance D2 of the claws 39 to a distance D3 that is shorter than the distance D1 as shown in FIG. 12H. Decreasing the distance D2 of the claws 39 in this way can press the leads 3d of the axial component 32 with a stronger force by the claws 39, thereby leading to more firmly clamping of the leads 3d by the claws 39.

Additionally, according to such a distance reduction, even when the distance of the insertion holes 2a of the substrate 2 is shorter than the distance D2 of the claws 39 (e.g., when the distance of the insertion holes 2a is the same as the distance D3), the distance of the leads 3d can be adjusted to the distance of the insertion holes 2a. Therefore, the leads 3d can accurately be inserted into the insertion holes 2a of the substrate 2.

Particularly, in this embodiment, the distance D3 is set to be shorter than the distance D1. According to such a setting, even if the distance of the insertion holes 2a of the substrate 2 is shorter than the distance D1 of the fixed forming-die 52, the distance of the leads 3d can be adjusted to the distance of the insertion holes 2a, and thus the leads 3d can accurately be inserted into the insertion holes 2a of the substrate 2. If the distance D3 is set to be shorter than the distance D1, for example, the distance D3 may be smaller than the distance D1 by 0.2 mm or more and 0.4 mm or less.

According to such a setting, the distance D1 of the fixed forming-die 52 can be set to be a large distance, and thus the contact positions between the movable forming-die 50 and the leads 3d of the axial component 32 can be set more outside and away from the body 3c. As a result, the body 3c can be restrained from being accidentally damaged by a contact with the movable forming-die 50. Particularly, if the axial component 32 is a diode or a resistor, etc., the body 3c is often long with respect to the distance of the insertion holes 2a of the substrate 2, and therefore, the setting of the distance described above is particularly effective.

Finally, a mounting step is performed (step S5). More specifically, the chuck unit 25 having the claws 39 clamping the axial component 32 is moved in the Z direction and also the X and Y directions to be disposed above the substrate 2, and then lowered in the Z direction to insert the leads 3d into the insertion holes 2a of the substrate 2. A specific method of this operation has already been described with reference to FIGS. 10A and 10B, and therefore its explanation is skipped.

By inserting the axial component 32 into the substrate 2 using the component mounting device 1 of the embodiment described above, a component-mounted substrate can be manufactured as the substrate 2 having the axial component 32 mounted thereon.

As described above, the chuck unit 25 serving as the distance adjustment portion makes an adjustment such that when the axial component 32 is delivered from the movable forming-die 50 to the mounting head 17 the distance D2 between the claws 39 of the mounting head 17 is larger than the distance D1 of the fixed forming-die 52. Such an adjustment leads to easily disposing of the axial component 32 in the space between the claws 39 of the mounting head 17, while the leads 3d having the spring property can naturally be biased outward and brought into contact with the claw 39. Additionally, making the adjustment such that the distance D2 between the claws 39 is larger than the distance D1 of the fixed forming-die 52 leads to hardly moving of the axial component 32 downward along with the movable forming-die 50 retracting downward after delivery of the component. Such a configuration enables the axial component 32 to be accurately delivered to the mounting head 17.

Figure 13:
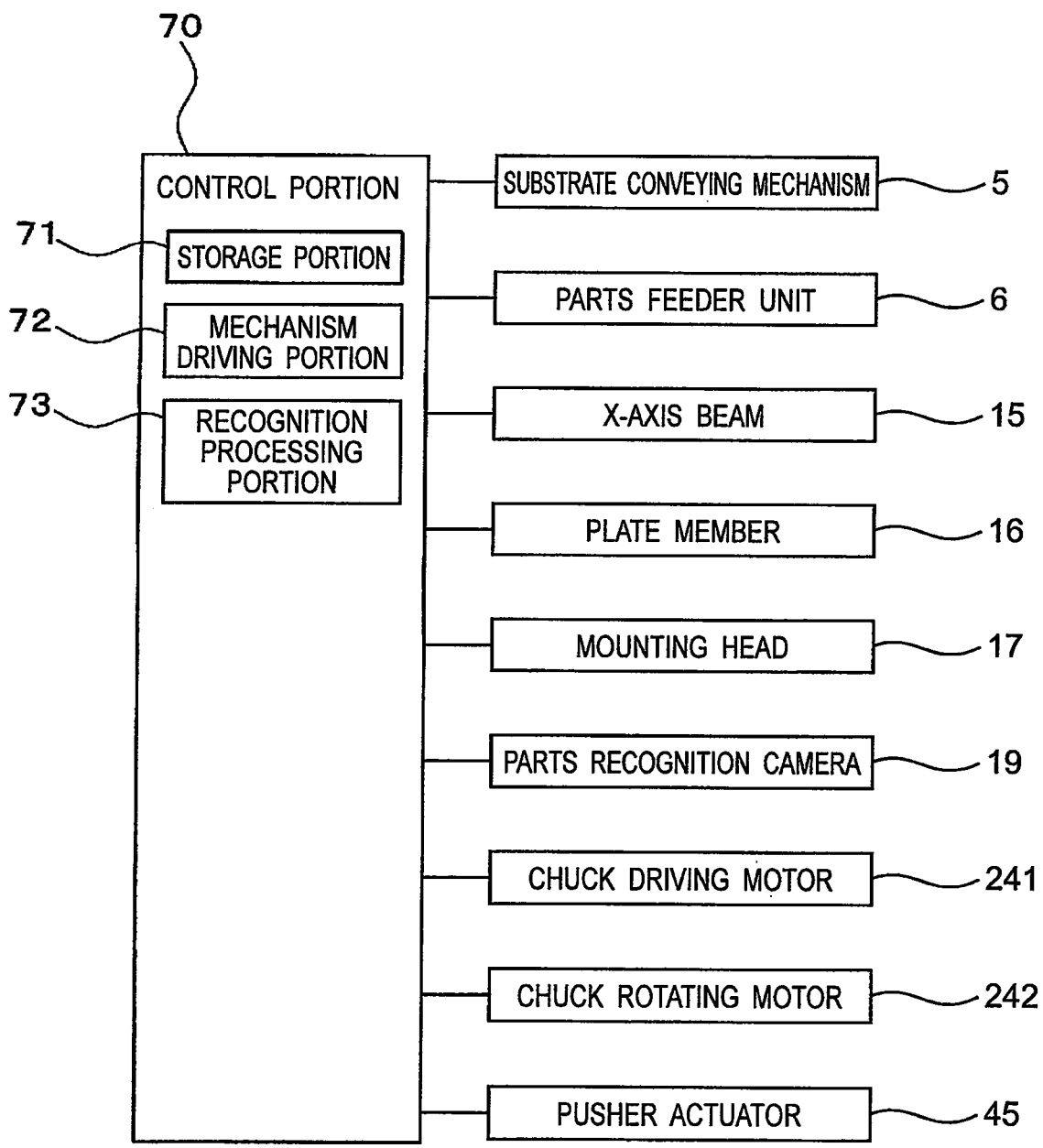
FIG. 13 is a block diagram for components of a control system of the component mounting device in the embodiment of the present invention.

A control system of the component mounting device 1 will be described with reference to FIG. 13. The controller 70 of the component mounting device 1 includes a storage portion 71, a mechanism driving portion 72, and a recognition processing portion 73. The controller 70 is connected to a substrate conveying mechanism 5, the components feeder unit 6, the X-axis beam 15, the plate member 16, the mounting head 17, the components recognition camera 19, the chuck driving motor 241, the chuck rotating motor 242, and the pusher actuator 45.

The storage portion 71 is configured to store various production data necessary for mounting the component 3 on the substrate 2. The mechanism driving portion 72 is controlled by the controller 70 to drive the substrate conveying mechanism 5, the components feeder unit 6, the X-axis beam 15, the plate member 16, the mounting head 17, the components recognition camera 19, the chuck driving motor 241, the chuck rotating motor 242, and the pusher actuator 45. As a result of the control, a component mounting work is performed. The mechanism driving portion 72 is also configured to drive the X-axis beam 15, the plate member 16, the mounting head 17, the chuck driving motor 241, and the chuck rotating motor 242. The chuck driving motor 241 and the chuck rotation motor 242 may preferably be servo motors. Particularly, using a servo motor for the chuck driving motor 241 enables switching depending on a type of the component 3 between "load control function" of preferentially controlling a clamping force of clamping the component 3 and "position control function" of preferentially controlling a distance between the claws 39.

The recognition processing part 73 executes a recognition process of an image acquired by the components recognition camera 19 to detect a substrate mark (not shown) formed on the substrate 2, to detect the component 3 fed to a components-feeding position by the components feeder unit 6, and to detect the component 3 held by the mounting head 17. Detection results of the substrate mark and the component 3 are used for aligning the mounting head 17 with the substrate 2 at the time of mounting the component 3.

Although the present invention has been described with the embodiment, the present invention is not limited to the embodiment. For example, in the description of the embodiment, step S4 defined as the distance reduction step is performed before the mounting head 17 is moved for insertion/mounting of the axial component 32; however, the present invention is not limited thereto. The distance reduction step may be performed during the movement of the mounting head 17 as long as the leads 3d have not been yet inserted by the mounting head 17 into the insertion holes 2a of the substrate 2, for example.

In the description of the embodiment, the chuck unit 25 serving as the distance adjustment portion for adjusting the distance of the claws 39 is configured as shown in FIGS. 4A and 4B; however, the present invention is not limited thereto. Any configuration of the chuck unit 25 may be employed as long as the chuck unit 25 can adjust the distance between the claw 39a and the claw 39b.

In the description of the embodiment, the adjustment is made such that the distance D3 of the claws 39 after the distance reduction step is smaller than the distance D1 of the fixed forming-die 52; however, the present invention is not limited thereto. The distance D3 of the claws 39 after the distance reduction step may be a value which is larger than the distance D1 of the fixed forming-die 52 as long as the value is smaller than the distance D2 of the claws 39 before the distance reduction step.

Although the description has sufficiently be made in the present disclosure in terms of the preferred embodiment with reference to the accompanying drawings, various modifications and alterations are apparent to those skilled in the art. It should be understood that such modifications and alterations not departing from the scope of the present disclosure according to the accompanying claims are included therein. Additionally, combination and order of elements of the embodiment can be changed without departing from the scope and the idea of the present disclosure.

It is to be noted that, by properly combining any of variations of the aforementioned embodiment, the effects possessed by them can be produced.

INDUSTRIAL APPLICABILITY

The present invention is applicable to any component mounting device and any method of manufacturing a component-mounted substrate using the same.

What is claimed is:

1. A method of manufacturing a component-mounted substrate by mounting an axial component on a substrate using a component mounting device, the method comprising:
 a forming step of bringing a movable forming-die into contact with two leads from below, the two leads having a spring property and extending laterally from a body of the axial components, to lift the leads in a bent state, wherein a movement of the leads in the bent state lifted by the movable forming-die is guided from the outside by a fixed forming-die disposed outside the movable forming-die;
 a delivery step of allowing a pair of claws of a mounting head disposed above the fixed forming-die to sandwich and clamp from both sides the leads in the bent state lifted by the movable forming-die;
 a retraction step of retracting the movable forming-die downward after the delivery of the axial components to the mounting head; and
 a mounting step of moving the mounting head that is clamping the axial component such that the leads of the clamped axial component is inserted into insertion holes of the substrate for mounting, wherein
 at the delivery step, a distance between the claws of the mounting head is set larger than a distance of the fixed forming-die,
 wherein the method further comprises a distance reduction step of decreasing the distance between the claws after the retraction step and before the mounting head inserts the leads of the axial component into the insertion holes of the substrate.

2. The method of manufacturing a component-mounted substrate according to claim 1, wherein at the distance reduction step, the distance between the claws is decreased to be shorter than the distance of the fixed forming-die.

3. The method of manufacturing a component-mounted substrate according to claim 1, wherein at the delivery step, the distance between the claws is set such that the claws press the leads of the axial components from the outside.

4. The method of manufacturing a component-mounted substrate according to claim 1, wherein at the delivery step, the distance between the claws is set to be larger than the distance of the fixed forming-die by 0.2 mm or more and 0.3 mm or less.

* * * * *